United States Patent
Zarkesh-Ha et al.

(10) Patent No.: US 7,689,964 B2
(45) Date of Patent: Mar. 30, 2010

(54) SYSTEM AND METHOD FOR ROUTING CONNECTIONS

(75) Inventors: Payman Zarkesh-Ha, Albuquerque, NM (US); Christopher L. Hamlin, Los Gatos, CA (US); Ashok K. Kapoor, Palo Alto, CA (US); James S. Koford, Monterey, CA (US); Madhukar B. Vora, Los Gatos, CA (US)

(73) Assignee: SuVolta, Inc., Los Gatos, CA (US)

( * ) Notice: Subject to any disclaimer, the term of this patent is extended or adjusted under 35 U.S.C. 154(b) by 125 days.

(21) Appl. No.: 11/960,452

(22) Filed: Dec. 19, 2007

(65) Prior Publication Data

US 2009/0164963 A1 Jun. 25, 2009

(51) Int. Cl.
*G06F 17/50* (2006.01)
(52) U.S. Cl. .............................. 716/13; 716/12; 716/14
(58) Field of Classification Search ........................ None
See application file for complete search history.

(56) References Cited

U.S. PATENT DOCUMENTS

| | | | |
|---|---|---|---|
| 6,230,304 B1 | 5/2001 | Groeneveld et al. ............. | 716/7 |
| 6,305,004 B1 | 10/2001 | Tellez et al. .................... | 716/12 |
| 6,449,761 B1* | 9/2002 | Greidinger et al. ............. | 716/11 |
| 6,505,334 B1* | 1/2003 | Tanaka .......................... | 716/13 |
| 7,380,231 B2* | 5/2008 | Zhang et al. ................... | 716/12 |
| 7,392,497 B2* | 6/2008 | Fassnacht et al. .............. | 716/12 |
| 2002/0184606 A1 | 12/2002 | Ohba et al. ..................... | 716/11 |
| 2005/0048764 A1 | 3/2005 | Kudo .......................... | 438/622 |
| 2007/0104029 A1 | 5/2007 | Guo ............................... | 367/59 |
| 2007/0136714 A1* | 6/2007 | Cohn et al. .................... | 716/13 |
| 2007/0143716 A1* | 6/2007 | Maziasz et al. ................ | 716/2 |
| 2007/0240090 A1 | 10/2007 | Bickford et al. ............... | 716/12 |
| 2008/0308816 A1 | 12/2008 | Miller et al. ................... | 257/76 |

OTHER PUBLICATIONS

*PCT Notification of Transmittal of the International Search Report and the Written Opinion of the International Searching Authority* for International Application No. PCT/US2008/085782; 13 pages, Feb. 27, 2009.

* cited by examiner

*Primary Examiner*—Leigh Marie Garbowski
(74) *Attorney, Agent, or Firm*—Baker Botts L.L.P.

(57) ABSTRACT

A method for modeling a circuit includes receiving a netlist that defines a plurality of connections between a plurality of circuit elements and identifying a subset of the connections. The method also includes routing the identified connections with a first group of wires having a first wire width and routing at least a portion of the remaining connections with a second wire width. The second wire width is smaller than the first wire width. The method further includes replacing the first group of wires with a third group of wires having the second wire width.

24 Claims, 4 Drawing Sheets

SYSTEM AND METHOD FOR ROUTING CONNECTIONS

TECHNICAL FIELD OF THE INVENTION

This invention relates, in general, to electronic design automation (EDA) tools for electronic circuits and, more particularly, to tools for optimizing interconnect elements within electronic circuits.

BACKGROUND OF THE INVENTION

As a result of the rapid technological growth of the past several decades, transistors and other semiconductor devices have become a fundamental building block for a wide range of electronic devices. As the performance demands on these electronic devices increases, there is a need for electronic circuits that are smaller and faster. With transistor performance approaching theoretical limits, minimizing the performance effect caused by interconnect between logic gates becomes an increasingly important aspect of device design.

In many respects, however, the evolution of electronic design automation (EDA) tools has not kept pace with the increases in performance demands. As a result, there is a need for EDA tools and design techniques that provide flexibility in optimizing the properties of electronic circuits to maximize overall device performance In particular, the ability to optimize the location, spacing, and/or dimensions of interconnect within electronic devices has become critical to maximizing performance.

SUMMARY OF THE INVENTION

In accordance with the present invention, the disadvantages and problems associated with prior semiconductor devices have been substantially reduced or eliminated.

In accordance with one embodiment of the present invention, a method for modeling a circuit includes receiving a netlist that defines a plurality of connections between a plurality of circuit elements and identifying a subset of the connections. The method also includes routing the identified connections with a first group of wires having a first wire width and routing at least a portion of the remaining connections with a second wire width. The second wire width is smaller than the first wire width. The method further includes replacing the first group of wires with a third group of wires having the second wire width.

In accordance with another embodiment of the present invention, a system for generating a model of a circuit includes a memory and a processor. The memory is capable of storing processor instructions. The processor is capable, when executing processor instructions, of receiving a netlist that defines a plurality of connections between a plurality of circuit elements and identifying a subset of the connections. The processor is also capable of routing the identified connections with a first group of wires having a first wire width and routing at least a portion of the remaining connections with a second wire width, wherein the second wire width is smaller than the first wire width. The processor is further capable of replacing the first group of wires with a third group of wires having the second wire width.

Technical advantages of certain embodiments of the present invention increased device performance with minimal size increases. Additional technical advantages include the ability to modify existing design tools to optimize wire spacing. Other technical advantages of the present invention will be readily apparent to one skilled in the art from the following figures, descriptions, and claims. Additionally, while specific advantages have been enumerated above, various embodiments may include all, some, or none of the enumerated advantages. The following technical advantages may be achieved by some, none, or all of the embodiments of the present invention.

BRIEF DESCRIPTION OF THE DRAWINGS

For a more complete understanding of the present invention and its advantages, reference is now made to the following descriptions, taken in conjunction with the accompanying drawings, in which.

DETAILED DESCRIPTION OF THE INVENTION

Figure 1:
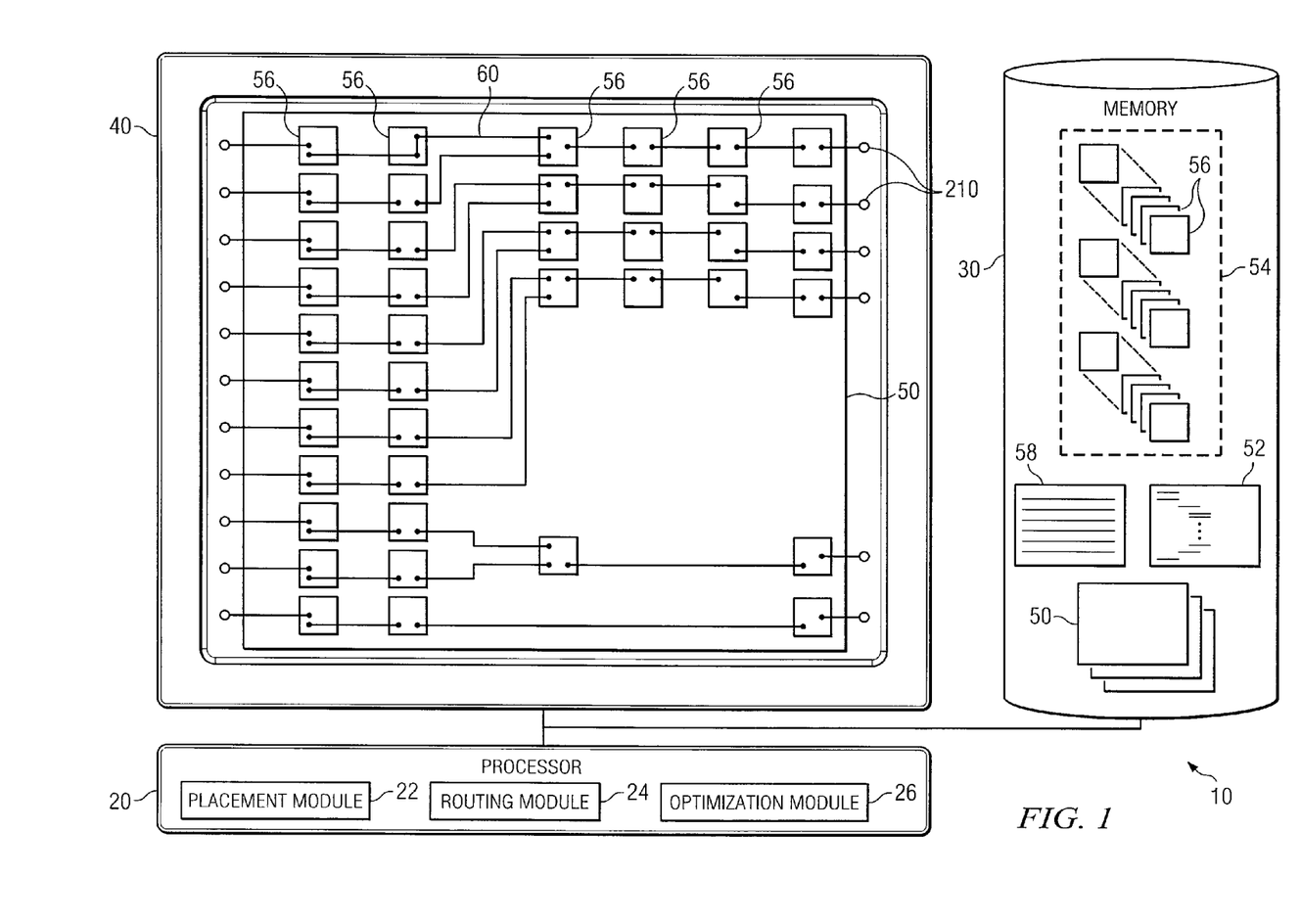
FIG. 1 illustrates a system for designing and modeling electronic circuits with improved performance.

FIG. 1A illustrates a system 10 for designing integrated electronic circuits. In the illustrated embodiment, system 10 includes a processor 20, a memory 30, and a display 40. Additionally, in particular embodiments, system 10 includes a plurality of modules capable of performing certain tasks related to the design, modeling, and/or simulation of electronic circuits, such as a placement module 22, a routing module 24, and an optimization module 26. In particular embodiments, system 10 may improve the performance of electronic circuits designed with system 10 by optimizing interconnect elements within the electronic circuits.

More specifically, in particular embodiments, the electronic circuits designed by or using system 10 include a plurality of circuit elements that are connected by a collection of wires to facilitate predetermined functionality in the relevant electronic circuit. By optimizing the spacing of these wires, as described further below, system 10 may reduce interconnect capacitance resulting from such wires. As a result of this reduction in the interconnect capacitance between the wires of the electronic circuit, the operating speed of the electronic circuit may be increased and/or the chip dynamic power dissipation may decrease.

Although the described techniques can be utilized on any appropriately configured design system, FIG. 1 illustrates one embodiment of an example system 10 that can be utilized to design chips having optimized wire spacing. As noted above, the illustrated embodiment of system 10 includes processor 20, memory 30, and display 40. Collectively, processor 20, memory 30, and display 40 allow a user of system 10 to create a circuit model 30 modeling an electronic circuit designed by or to be designed by system 10.

Processor 20 may be a general-purpose computer, dedicated microprocessor, or other processing device capable of communicating and processing electronic information. Examples of processor 20 include application-specific integrated circuits (ASICs), field-programmable gate arrays (FPGAs), digital signal processors (DSPs) and any other suitable specific- or general-purpose processors. In particular embodiments, processor 20 operates by executing processor instructions stored in memory 30. Although FIG. 1 illustrates a particular embodiment of system 10 that includes a particular number of processors 20, system 10 may, in general, include any suitable number of processors 10.

Memory 30 stores processor instructions, circuit models 50, netlists 52, cell libraries 54, design rules 58, and/or other values, parameters, and data utilized by system 10 during operation. Memory 30 may comprise any collection and arrangement of volatile or non-volatile, local or remote devices suitable for storing data, such as for example random access memory (RAM) devices, read only memory (ROM) devices, magnetic storage devices, optical storage devices, or any other suitable data storage devices. The description below uses the term "memory 30" to refer to any such memory device or memory devices in system 10, coupled to system 10, or otherwise accessible by system 10 or elements of system 10.

Display 40 displays circuit model 50, results of simulations involving circuit model 50, and any other appropriate information associated with the electronic circuit corresponding to circuit model 50. In particular embodiments, display 40 may represent a computer monitor or television screen capable of receiving graphics information and/or video signals from processor 20. More generally, however, display 40 may represent any appropriate combination of hardware and/or software capable of displaying information related to circuit model 50 to a user of system 10.

Circuit model 50 represents a model of an electronic circuit. More specifically, circuit model 50 represents any suitable information describing location, operation, and/or composition of the elements within the modeled electronic circuit. The modeled electronic circuit may include any appropriate collection of electronic components, devices, and/or elements. In particular embodiments, circuit model 50 comprises a database object that includes or references a plurality of element models 56 in a circuit being designed by system 10.

Element models 56 each represent a model of an electronic component, device, and/or element that is combined with other circuit elements to provide the functionality of circuits designed by system 10. Element models 56 may model passive elements (such as resistors and capacitors) or active elements (such as transistors). Additionally, in particular embodiments, certain element models 56 may model groups of multiple elements. For example, a particular element model 56 may model a group of transistors that form a logic gate, such as a NAND gate. More generally, each element model 56 may model any appropriate electronic components, device, and/or element or any appropriate group of components, devices, or elements. The description below focuses, for the sake of illustration, on an embodiment in which each element model 56 represents an instance of a particular cell within cell library 54 used to design and simulate circuit model 50. Each cell within cell library 54 represents a model of a particular logic gate, component (such as a transistor, resistor, or capacitor), or other type of electronic element that can be instantiated as appropriate within circuit model 50 to form a circuit having the desired functionality.

In addition, each element model 56 models one or more terminals at which input and output signals are received and transmitted, respectively. These terminals may be connected by wires 60 based on the desired functionality and characteristics of the relevant electronic circuit. As discussed further below, system 10 may improve the performance of the modeled circuit by optimizing the spacing and/or location of these wires 60.

As shown in FIG. 1, system 10 may also include one or more modules (such as modules 22, 24, and 26) that perform various tasks relating to the design, simulation, or manufacture of electronic circuits. Examples of the functionality provided by such modules in particular embodiments of system 10 include, but are not limited to, logic synthesis, cell placement, routing, clock synthesis, timing and power analysis, and design verification. The specific functionality provided depends on the configuration and capabilities of the particular embodiment of system 10. For example, in the illustrated embodiment, system 10 includes a placement module 22, a routing module 24, and an optimization module 26 that provide functionality as described below. Although the description below focuses, for purposes of illustration, on a particular embodiment of system 10 in which system 10 provides certain design and simulation functionality, system 10 may, more generally, provide any appropriate functionality relating to the design, modeling, and/or simulation of electronic circuits.

Modules 22, 24, and 26 may represent physical components within data processing system 10, software processes running on data processing system 10, and/or any other form of computational or processing resources. In particular embodiments, modules 22, 24, and 26 represent software processes executing on processor 20. For example, modules 22, 24, and 26 may each represent a portion of an EDA computer application such as a place-and-route tool and/or software processes spawned by such an application. More generally, however, modules 22, 24, and 26 may each represent or include any collection of software and/or hardware appropriate to provide the described functionality.

In operation, system 10 provides functionality to complete or facilitate completion of certain steps relating to the design, testing, and/or manufacture of electronic circuits. In particular, the illustrated embodiment includes placement module 22, routing module 24, and optimization module 26 that provide specific design functionality. As a result of the operation of placement module 22, routing module 24, and optimization module 26, a user of the illustrated embodiment of system 10 can create circuit model 50 that can be used for simulation, testing, and/or manufacture of the relevant circuit.

As part of an example design process, system 10 may receive, generate, or retrieve (e.g., from memory 30) information identifying the contents and relationship between various electronic components of an electrical circuit to be modeled by system 10. For example, placement module 22 may receive information specifying a collection of circuit components in an electronic circuit and generate a corresponding circuit model 50 and a set of connections between the circuit components within circuit model 50. As one specific example, system 10 may receive a netlist 52 that defines a plurality of circuit elements and one or more connections between the defined circuit elements. In particular embodiments, netlist 52 may represent a Very-High-Speed Integrated-Circuit Hardware Description Language (VHDL), Verilog, or other appropriate Hardware Description Language file or files. More generally, however, netlist 52 may represent any appropriate information defining circuit elements included in the electronic circuit and connections between these circuit elements.

System 10 may, based on this information, create a circuit model 50 that contains or references this information and models the composition and/or operation of the relevant electronic circuit. System 10 may also receive, generate, or retrieve information describing the various components included in the relevant electronic circuit. For example, in particular embodiments, netlist 52 may be associated with a cell library 54 comprising a plurality of element models 56 that each represent a particular logic gate or other circuit element that can be instantiated one or more times within circuit model 50, as needed, to form an accurate model of the relevant electronic circuit.

System 10 may also receive, generate, or retrieve information describing additional requirements or constraints to be satisfied by the electronic circuit to be designed by system 10. For example, system 10 may receive, generate, or retrieve design rules 58 that include placement and routing constraints, power requirements for the relevant electric circuit, and other information to guide the design of the electronic circuit defined by netlist 52. This information may be used by modules 22, 24, and 26 in designing the electronic circuit.

Once system 10 has created, received, or retrieved circuit model 50 and any associated element models 56, placement module 22 may position element models 56 corresponding to the various circuit elements of the electronic circuit within circuit model 50. Placement modules 22 may select the position for these element models 56 based on connections specified by netlist 52, constraints included in design rules 58, and/or other appropriate information associated with the relevant electronic circuit. Moreover, in particular embodiments, placement module 22 may position the various element models 56 so as to minimize signal delay for some or all of signals transmitted between the various element models 56, to reduce interference among these signals, to limit clock skew between the corresponding elements, and/or to achieve other appropriate objectives.

Furthermore, placement module 22 may, in particular embodiments, perform fully-automated placement of the element models 56 included within circuit model 50. In alternative embodiments, placement module 22 may receive input from a user to allow the user to, in part or in whole, manually position element models 56. In yet alternative embodiments, placement module 22 may place element models 56 based, at least in part, on placement information received from other components or tools. Additionally, in particular embodiments, system 10 may begin operation on circuit model 50 with element models 56 already placed by an external placement tool and no placement may be performed by system 10. Once placement has been completed, placement module 22 (and/or other appropriate elements of system 10) may perform clock tree synthesis, power routing, and/or any other appropriate post-placement operations.

Additionally, after element models 56 have been placed within circuit model, routing module 24 (or other appropriate components of system 10) may route the various nets connecting the element models 56 of circuit model 50. As part of routing these nets, routing module 24 may, for each net, generate models for wires 60 connecting the appropriate ports of the circuit elements associated with that net. In particular embodiments, system 10 routes the identified connections based on design rules 58 associated with circuit model 50 and/or cell library 54. Design rules 58 may define spacing requirements, layer restrictions, object sizes, and/or other constraint that system 10 considers when routing the identified connections. As part of routing these connections, system 10 may generate a model of a wire (represented graphically in display 40 by any of wires 60) connecting specific terminals of the relevant element models 56 and add these wires 60 to circuit model 50.

Because the spacing between wires 60 and other objects within circuit model 50 (such as other wires 60) affects the delay induced in signals traveling on wires 60, it may be desirable to space wires 60 as far apart as possible. However, increasing the spacing between wires may result in an unacceptably large overall size for circuit model 50. Consequently, it may not be possible and/or desirable to provide the maximum spacing for each wire 60 within circuit model 50.

In many circuits, however, the overall speed of the circuit is governed by only a handful of critical nets. For example, in certain embodiments, the signals in a circuit experiencing the longest delay may limit the maximum operating speed achievable by the circuit. In other embodiments, delays in certain specific signals may cause delays in many others that are based on those signals or triggered by them. As a result, increasing the spacing for only certain critical nets may improve the performance of the circuit noticeably with no or negligible increases in the overall size of the circuit.

Thus, in particular embodiments, system 10 may identify certain critical nets within the circuit being modeled and may then use special spacing distances for wires 60 connecting the terminals of those critical nets. System 10 may use smaller, standard spacing for wires connecting all other nets. For example, in particular embodiments, system 10 can reduce signal delay in a particular circuit by 20% with negligible increases in circuit size, by doubling the space between the wires 60 for critical nets and other wires 60 in the relevant circuit.

However, the components of system 10 may, in certain embodiments, be unable to provide this optimization as part of the standard routing process. For example, in particular embodiments, routing module 24 may be part of a commercially-available place-and-route software application that does not allow users to set different spacing requirements for different nets. Thus, particular embodiments of system 10 may include an optimization module 26 that is capable of identifying critical nets and/or optimizing the spacing of wires 60 used to route these critical nets. For example, in particular embodiments, optimization module 26 may represent an add-on or helper application that can be used in conjunction with or added to a commercially-available place-and-route tool. This add-on or helper application may be capable of modifying the standard routing process performed by the place-and-route tool to facilitate use of the spacing techniques described here.

Optimization module 26 begins an example optimization process by identifying the critical nets on which to use these special spacing distances. Optimization module 26 may identify these critical nets in any appropriate manner. For example, in particular embodiments, system 10 may estimate a wire length for each net based on the placement of element models 56 in circuit model 50. System 10 may then identify a certain number of nets with the longest wire-length estimates as critical nets, identify all nets having a wire-length estimate greater than a particular threshold length as critical nets, or identify a collection of critical nets in any other appropriate manner based on the wire-length estimates. More generally, however, system 10 may utilize any appropriate factor or consideration to identify the critical nets. Moreover, in particular embodiments, a user of system 10 may specify critical nets by manually inputting the critical nets or by providing a file specifying the critical nets.

After identifying the critical nets, optimization module 26 may then create wires 60 for these critical nets with increased spacing between wires 60 and other relevant objects in circuit model 50 (such as other wires 60) or optimization module 26 may modify wires 60 formed by routing module 24 to satisfy the increased spacing requirements. System 10 may be configured so that this spacing optimization is done automatically by the appropriate components (such as routing module 24) during routing. As a result, in particular embodiments, routing module 24 may route the critical nets with the increased spacing requirements as part of the normal routing process. Consequently, optimization module 26 may represent, in part or in whole, the same components as routing module 24.

Because the spacing between wires 60 may be hard-coded in certain embodiments of system 10, however, it may not be possible to alter the spacing only for selected nets as part of the standard routing process. As a result, in such embodiments, optimization module 26 may modify routings made by routing module 24 to achieve the improved wire spacing. In such embodiments, optimization module 26 may take any appropriate steps before and/or after routing to modify the wire routings created by routing module 24 or to cause routing module 24 to alter the manner in which routing module 24 creates these routings.

For example, in particular embodiments, wire widths may be adjusted more easily than the spacing between wires. As a result, in such embodiments, optimization module 26 may, before routing module 24 performs routing, set a value for the width of wires 60 to be used in routing the critical nets to greater than the default width that would otherwise be used for those wires 60. As a result, routing module 24 then routes these critical nets using a wire width that is larger than the default wire width for those wires 60, thereby forcing routing module 24 to space other wires 60 further from the centerline of critical net wires 60 because of these wider wires 60. In particular embodiments, the wire width for critical nets may be greater than the default wire width by twice the default minimum spacing.

Figure 2A:
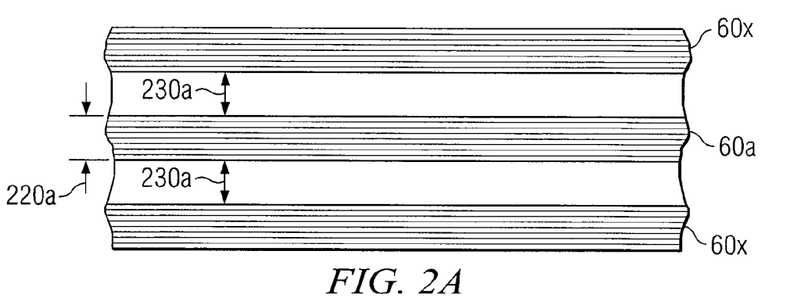
FIG. 2 shows examples of how the system of FIG. 1 may space wires under particular circumstances when routing electronic circuits.
Figure 2B:
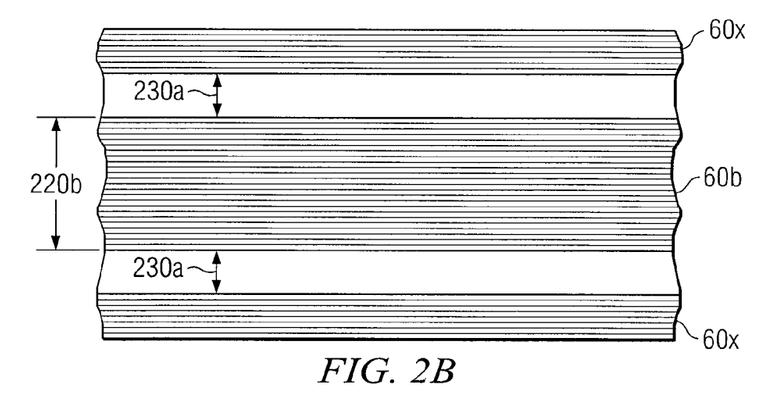
Figure 2C:
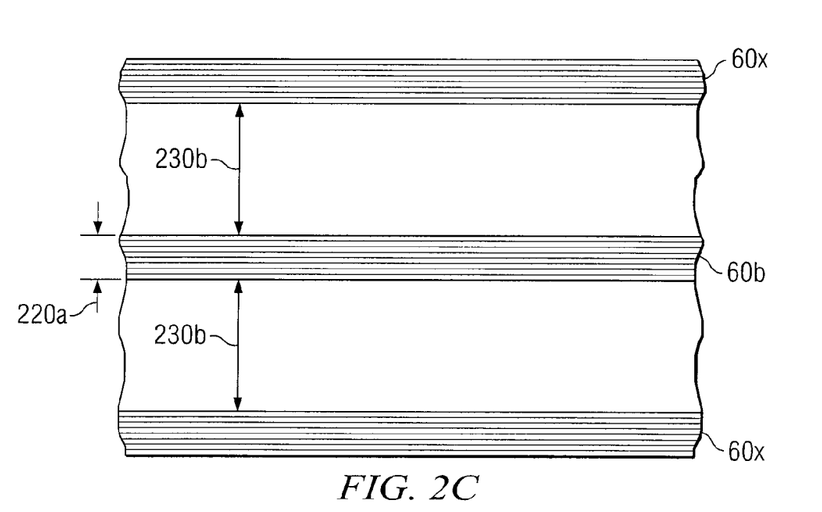

The increased wire width in itself may not, however, result in any greater spacing between the boundaries of critical net wires 60 and those of neighboring wires 60. Thus, optimization module may subsequently reduce the width of critical nets wires 60 to the default wire width after routing has been completed. Consequently, the distance between any critical net wire 60 and its closest neighboring wires 60 is increased, thereby reducing the delay experienced by signals traveling on those wires 60. As noted above, in particular embodiments, critical nets are wired with wires 60 that are greater than the default wire width by twice the default minimum spacing. As a result, when wires 60 for critical nets are reduced to the default width, each of the wires 60 for critical nets will be separated from neighboring wires 60 by at least twice the default spacing. FIGS. 2A-2C illustrate this process in greater detail.

After routing circuit model 50 and performing any appropriate optimization, system 10 may store the routed version of circuit model 50, including placed element models 56 and models for wires 60, in memory 30. In particular embodiments, the routed circuit model 50 may then be output for use in the fabrication of a circuit corresponding to circuit model 50 or analyzed and revised to address other design issues before being used in production. In particular embodiments, the electronic circuit resulting from such fabrication will utilize increased spacing around wires 60 associated with the critical nets in the modeled design of circuit model 50. An example of such a circuit is discussed below with respect to FIG. 3.

As a result of the described techniques, the signals traveling on wires 60 associated with critical nets will experience less delay than these signals would experience if the relevant wires 60 were spaced at the default spacing for circuit model 50. Consequently, in particular embodiments, the fabricated circuit model 50 may operate at higher speeds. Moreover, in particular embodiments, this faster speed may be achieved with a smaller increase in size than would result if design rules 58 were changed to require increased spacing for all nets. Additionally, by adjusting the wire width for the critical nets as described, particular embodiments of system 10 may be able to achieve the increased operating speed with minimal or no changes to routing module 24. Furthermore, in particular embodiments, this increased spacing may lead to lower overall wire capacitance, which may reduce the dynamic power consumption in critical nets. Thus, particular embodiments of system 10 may provide numerous benefits. Nonetheless, certain embodiments may provide some, none, or all of these benefits.

Although the description above focuses on an embodiment of system 10 in which optimization module 26 performs optimization automatically, in particular embodiments of system 10, a user may manually instruct system 10 to perform some or all of the optimization steps. As a result in such embodiments, optimization module 26 may represent, in part or in whole, the user interface and/or file access components that allow the user to adjust wire width settings before routing, to reduce the wire widths after routing, and/or to perform other tasks related to increasing the wire spacing for critical nets.

FIGS. 2A-2C illustrate example wire spacings that may be implemented in particular embodiments of system 10. More specifically, FIG. 2A illustrates a wire 60a that routing module 24 generates, in accordance with design rules 58, to connect a plurality of terminals 210 on a non-critical net. As is shown in FIG. 2A, wire 60a has a first wire width (represented by arrow 220a). As noted above, routing module 24 may use this first width for some or all wires 60 generated for non-critical nets. Additionally, as also shown in FIG. 2A, wire 60a is separated from other wires 60x by a default spacing (represented by arrow 230a).

FIG. 2B illustrates a wire 60b that routing module 24, in particular embodiments, may initially generate to connect a plurality of terminals on a critical net. As is shown in FIG. 2B, wire 60b has a second wire width (represented by arrow 220b). As noted above, routing module 24 may, in particular embodiments, generate wires having the second width to make connections for all critical nets. Additionally, as also shown in FIG. 2B, wire 60b is separated from other wires 60x by the default spacing (represented again by arrow 230a).

FIG. 2C illustrates wire 60b after optimization module 26 adjusts the width of wire 60b. As discussed above, optimization module 26 may adjust the width of wires 60 associated with critical nets after routing module performs an initial routing of these nets. In particular, optimization module 26 may reduce the width of wires 60 associated with critical nets to the default width. Consequently, as is shown in FIG. 2C, wire 60b has the first wire width (represented again by arrow 220a) after optimization module 26 adjusts the width of wire 60b. However, as also shown in FIG. 2C, wire 60b is now separated from other wires 60x by a greater amount than the default spacing (represented by arrow 230c in FIG. 2C). In particular embodiments, after optimization module 26 adjusts the wire width of wire 60b, wire 60b is separated from other wires 60x by twice the default spacing defined by design rules 58. Moreover, in certain embodiments, this double spacing may result in a 20% reduction in signal delay in wire 60b routed with the increased spacing.

Figure 3:
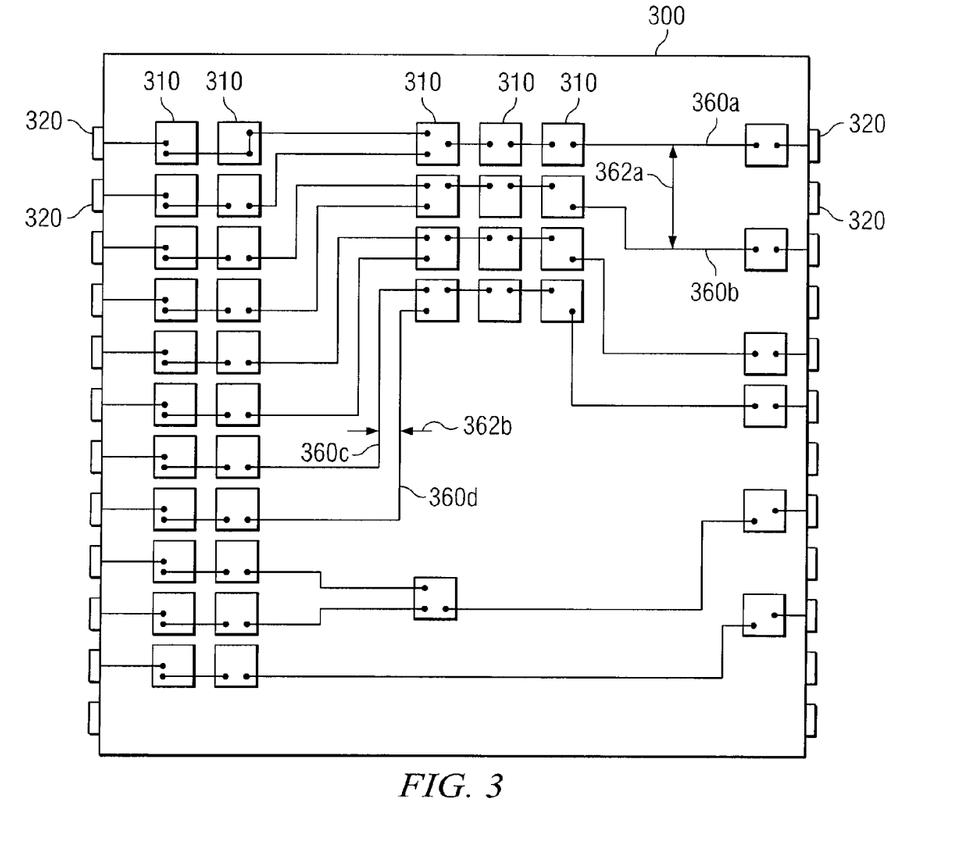
FIG. 3 illustrates an example of a circuit that may be designed using particular embodiments of the system of FIG. 1.

FIG. 3 shows an example electronic circuit 300 that may be produced from a circuit model 50 designed using particular embodiments of system 10. Electronic circuit 300 includes a plurality of circuit components 310. As FIG. 3 illustrates, circuit element 310 of electronic circuit 300 are connected by metal wires 360 to on another and pins 320. Metal wires 360 associated with critical nets (such as metal wires 360a and 360b) are spaced according to a first minimum distance requirement (shown by arrow 362a). Metal wires 60 associated with other nets (such as metal wires 360c and 360d) are spaced according to a second minimum distance requirement (shown by arrow 362b). Because, in the illustrated embodiment, critical nets are routed with larger spacing requirements than other nets, electronic circuits produced based on designs generated by system 10 may exhibit improved speed and/or performance.

Figure 4:
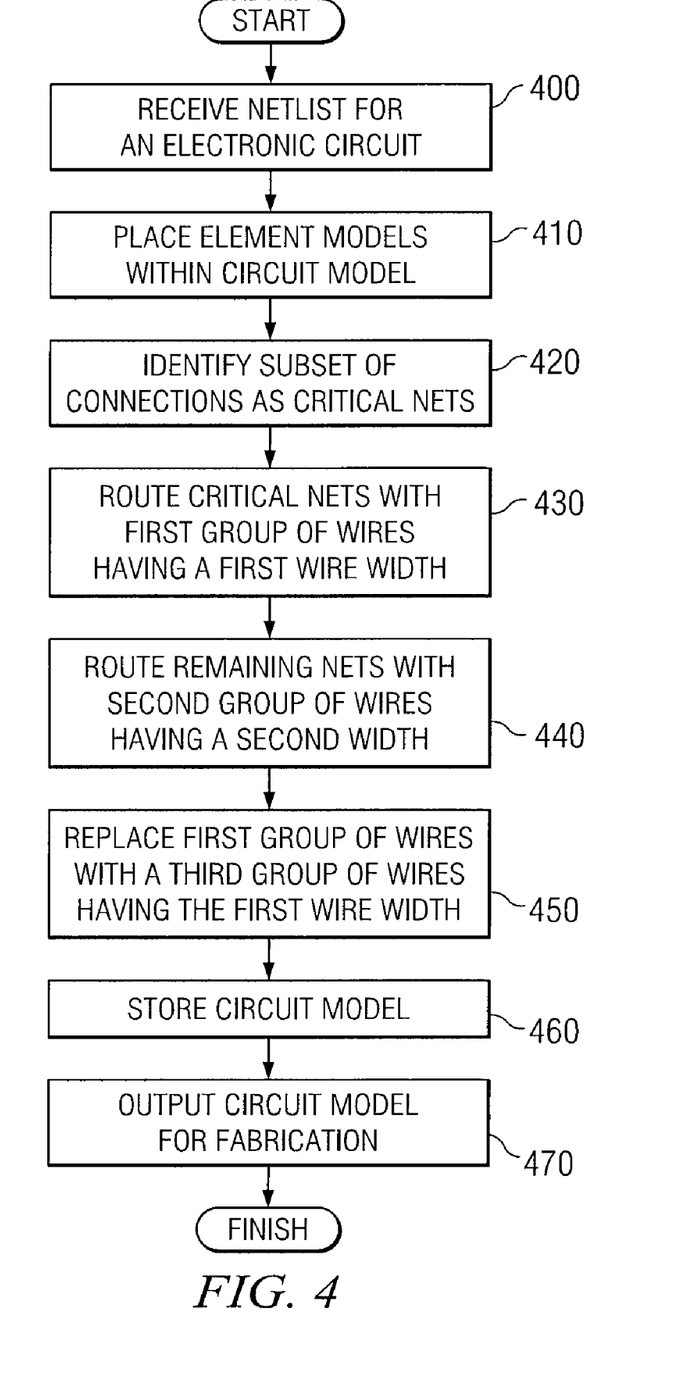
FIG. 4 is a flowchart illustrating an example method for creating a model of an electronic circuit with improved performance.

FIG. 4 is a flowchart detailing an example operation of system 10. In particular, FIG. 4 illustrates the operation of system 10 that increases wire spacing for critical nets by setting critical net wire widths before routing and reducing these wire widths once routing has been completed. The steps illustrated in FIG. 4 may be combined, modified, or deleted where appropriate. Additional steps may also be added to the example operation. Furthermore, the described steps may be performed in any suitable order.

Operation of the described embodiment of system 10 begins at step 400 with system 10 receiving netlist 52 associated with an electronic circuit to be designed using system 10. In particular embodiments, netlist 52 describes or identifies a plurality of circuit elements that make up the electronic circuit and defines a plurality of connections between these circuit elements. In particular embodiments, system 10 may place element models 56 corresponding to these circuit elements within circuit model 50 at step 410. As discussed above, element models 56 may be placed based on netlist 52, cell library 54, design rules 58, and/or other appropriate information associated with the relevant electronic circuit. Moreover, in particular embodiments, system 10 may select locations for the various element models 56 so as to minimize signal delay for some or all of signals transmitted between the various element models 56, to reduce interference among these signals, to limit clock skew between the corresponding elements, and/or to achieve other appropriate objectives.

At step 420, system 10 identifies a subset of the connections defined by netlist 52 that are critical nets. System 10 may identify critical nets based on timing constraints, wire-length estimates, or other appropriate factors associated with the identified critical nets. In particular embodiments, system 10 may mark these critical nets in circuit model 50 or otherwise store information identifying the critical nets in memory 30.

System 10 then routes the connections of the electronic circuit. As part of routing these connections, system 10 routes the identified critical nets with a first group of wires at step 430. The first group of wires all have a width equal to or greater than a first wire width associated with circuit model 50. In particular embodiments, design rules 58 include information defining a minimum spacing for particular types of wires 60 routed within circuit models 50 associated with design rules 58. As a result, the first group of wires may be routed with a minimum spacing between the boundaries of each of the first group of wires and certain other objects in circuit model 50 (e.g., other wires 60 on the same metal layer).

System 10 also routes some or all of the remaining nets of the electronic circuit. More specifically, in particular embodiments, system 10 routes the remaining nets with a second group of wires at step 440. The second group of wires all have a width equal to or less than a second wire width associated with circuit model 50. This second wire width is less than the first wire width. In particular embodiments, the second group of wires may be routed with the same minimum spacing between the boundaries of each of the second group of wires and relevant objects of circuit model 50.

After routing the nets of the electronic circuit, system 10 may modify circuit model 50 to optimize spacing of wires 60 within circuit model 50. For example, in particular embodiments, system 10 may replace the first group of wires 60 with a third group of wires 60 at step 450. The third group of wires 60 all have a width equal to or less than the second wire width.

Because the first group of wires 60 were routed to meet minimum spacing requirements under the assumption that the underlying nets would be routed using larger wires 60, the distance between the third group of wires 60 that remain following the optimization and other objects within circuit model 50 is greater than would have resulted had the third group of wires 60 initially been routed with the second wire width. Thus, as a result of this optimization step, signals traveling on the wires 60 associated with these critical nets will experience less delay than these signals would experience if the relevant wires 60 were spaced at the default spacing for circuit model 50. Consequently, in particular embodiments, electronic circuits produced from circuit model 50 may operate at higher speeds.

Circuit model 50, including all remaining wires 60, may then be stored at step 460. At step 470, circuit model 50 may be output from system 10 in a suitable format for electronic circuits to be fabricated based on circuit model 50. The operation of system 10 with respect to designing and modeling the relevant electronic circuit may then end as shown in FIG. 4. After circuit model 50 is output by system 10, electronic circuits may be fabricated based on circuit model 50.

Although the present invention has been described with several embodiments, a myriad of changes, variations, alterations, transformations, and modifications may be suggested to one skilled in the art, and it is intended that the present invention encompass such changes, variations, alterations, transformations, and modifications as fall within the scope of the appended claims.

What is claimed is:

1. A method for modeling a circuit, comprising:
receiving a netlist that defines a plurality of connections between a plurality of circuit elements;
identifying, with an electronic processor, a subset of the connections;
routing the identified connections with a first group of wires based on a first minimum spacing distance, wherein each of the first group of wires has a first wire width;
routing at least a portion of the remaining connections with a second group of wires based on the first minimum spacing distance, wherein each of the second group of wires has a second wire width and the second wire width is smaller than the first wire width; and
replacing the first group of wires with a third group of wires having the second wire width, wherein each of the wires in the third group is separated from other wires by at least a second minimum spacing distance and the second minimum spacing distance is greater than the first minimum spacing distance.

2. The method of claim 1, wherein identifying a subset of connections comprises identifying a subset based on one or more wire-length estimates associated with each connection in the subset.

3. The method of claim 1, wherein the first wire width is equal to the second wire width plus two times the second minimum spacing distance.

4. The method of claim 1, wherein identifying the subset of the connections comprises receiving a list specifying the connections in the subset.

5. The method of claim 1, wherein identifying the subset of the connections comprises identifying the subset of connections based on one or more timing requirements associated with the identified connections.

6. The method of claim 1, wherein at least one of the plurality of circuit elements comprises a transistor.

7. The method of claim 6, wherein the transistor comprises a junction field effect (JFET) transistor.

8. The method of claim 1, further comprising generating a circuit model comprising a model of each of the circuit elements, and wherein:
routing the identified connections with a first group of wires having a first wire width comprises generating, for each of the identified connections, a model of a wire that has a first wire width and connects models of two or more circuit elements associated with that connection;
routing at least a portion of the remaining connections with a second wire width comprises generating, for each of the portion of remaining connections, a model of a wire that has a second wire width and connects models of two or more circuit elements associated with that connection.

9. The method of claim 8, wherein replacing the first group of wires with a third group of wires having the second wire width comprises generating, for each the identified connections, a model of a wire that has the second wire width and connects models of two or more circuit elements associated with that connection.

10. A system for generating a model of a circuit, comprising:
a memory operable to store processor instructions; and
a processor operable, when executing processor instructions, to:
receive a netlist that defines a plurality of connections between a plurality of circuit elements;
identify a subset of the connections;
route the identified connections with a first group of wires based on a first minimum spacing distance, wherein each of the first group of wires has a first wire width;
route at least a portion of the remaining connections with a second group of wires based on the first minimum spacing distance, wherein each of the second group of wires has a second wire width and the second wire width is smaller than the first wire width; and
replace the first group of wires with a third group of wires having the second wire width, wherein each of the wires in the third group is separated from other wires by at least a second minimum spacing distance and the second minimum spacing distance is greater than the first minimum spacing distance.

11. The system of claim 10, wherein the processor is operable to:
wherein the first wire width is equal to the second wire width plus two times the second minimum spacing distance.

12. The system of claim 10, wherein the processor is operable to identify the subset of the connections by receiving a list specifying the connections in the subset.

13. The system of claim 10, wherein the processor is operable to identify the subset of the connections by identifying the subset of connections based on one or more timing requirements associated with the identified connections.

14. The system of claim 10, wherein at least one of the plurality of circuit elements comprises a transistor.

15. The system of claim 14, wherein the transistor comprises a junction field effect (JFET) transistor.

16. The system of claim 10, wherein the processor is further operable to:
generate a circuit model comprising a model of each of the circuit elements;
route the identified connections comprises generating, for each connection, a model of a wire connecting models of two or more of the circuit elements associated with that connection;
routing at least a portion of the remaining connections comprises generating, for each of the portion of remaining connections, a model of a wire connecting models of two or more of the circuit elements associated with that connection.

17. A computer product comprising computer-readable instructions encoded in electronic media, the instructions operable when executed to:
receive a netlist that defines a plurality of connections between a plurality of circuit elements;
identify a subset of the connections;
route the identified connections with a first group of wires based on a first minimum spacing distance, wherein each of the first group of wires has a first wire width;
route at least a portion of the remaining connections with a second group of wires based on the first minimum spacing distance, wherein each of the second group of wires has a second wire width and the second wire width is smaller than the first wire width; and
replace the first group of wires with a third group of wires having the second wire width, wherein each of the wires in the third group is separated from other wires by at least a second minimum spacing distance and the second minimum spacing distance is greater than the first minimum spacing distance.

18. The computer product of claim 17, wherein the first wire width is equal to the second wire width plus two times the second minimum spacing distance.

19. The computer product of claim 17, wherein the instructions are operable to identify the subset of the connections by receiving a list specifying the connections in the subset.

20. The computer product of claim 17, wherein the instructions are operable to identify the subset of the connections by identifying the subset of connections based on one or more timing requirements associated with the identified connections.

21. The computer product of claim 17, wherein at least one of the plurality of circuit elements comprises a transistor.

22. The computer product of claim 21, wherein the transistor comprises a junction field effect (JFET) transistor.

23. The computer product of claim 17, wherein the instructions are further operable to:
generate a circuit model comprising a model of each of the circuit elements;
route the identified connections comprises generating, for each connection, a model of a wire connecting two or more of the circuit elements associated with that connection;
routing at least a portion of the remaining connections comprises generating, for each of the portion of remaining connections, a model of a wire connecting two or more of the circuit elements associated with that connection.

24. A system for modeling a circuit, comprising:

means for receiving a netlist that defines a plurality of connections between a plurality of circuit elements;

means for identifying a subset of the connections;

means for routing the identified connections with a first group of wires based on a first minimum spacing distance, wherein each of the first group of wires has a first wire width;

means for routing at least a portion of the remaining connections with a second group of wires based on the first minimum spacing distance, wherein each of the second group of wires has a second wire width and the second wire width is smaller than the first wire width; and means for replacing the first group of wires with a third group of wires having the second wire width, wherein each of the wires in the third group is separated from other wires by at least a second minimum spacing distance and the second minimum spacing distance is greater than the first minimum spacing distance.

* * * * *